United States Patent
Mount et al.

(10) Patent No.: US 10,527,686 B1
(45) Date of Patent: Jan. 7, 2020

(54) METHOD AND SYSTEM FOR PERFORMING MAGNETIC ANOMALY SENSING

(71) Applicant: United States of America as Represented by the Secretary of the Navy, Arlington, VA (US)

(72) Inventors: Emily Mount, Panama City, FL (US); Neil Claussen, Panama City, FL (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 277 days.

(21) Appl. No.: 15/804,300

(22) Filed: Nov. 6, 2017

(51) Int. Cl.
*G01R 33/022* (2006.01)
*G01R 33/02* (2006.01)
*H01L 21/00* (2006.01)

(52) U.S. Cl.
CPC ....... *G01R 33/022* (2013.01); *G01R 33/0206* (2013.01)

(58) Field of Classification Search
CPC ....... H01L 21/00; H01L 2221/00; G01R 1/00; G01V 1/00; G01V 220/00; G01C 1/00; G01L 1/00; G01L 7/00; H01F 1/00
See application file for complete search history.

(56) References Cited

U.S. PATENT DOCUMENTS

| | | | | |
|---|---|---|---|---|
| 5,230,387 A | * | 7/1993 | Waters | E21B 7/068 175/45 |
| 6,841,994 B1 | * | 1/2005 | Wiegert | G01V 3/15 324/244 |
| 7,342,399 B1 | * | 3/2008 | Wiegert | G01P 3/66 324/207.11 |
| 2002/0005717 A1 | * | 1/2002 | Spitzer | B82Y 25/00 324/252 |
| 2007/0096729 A1 | * | 5/2007 | Brunson | G01R 33/022 324/244 |

* cited by examiner

*Primary Examiner* — Huy Q Phan
*Assistant Examiner* — Temilade S Rhodes-Vivour
(74) *Attorney, Agent, or Firm* — James T. Shepherd

(57) ABSTRACT

A method and system are provided for performing magnetic anomaly sensing. Each of two magnetometers generates magnetic field measurements. The magnetometers define a one-dimensional gradiometer having a baseline between them. A difference value is generated using the magnetic field measurements. The magnetometers are independently moved to maintain the baseline when the difference value is unchanging. Detection of a magnetic anomaly by a first magnetometer is indicated when the difference value deviates. The second magnetometer is then maneuvered until the magnetic field measurements generated thereby are indicative of detection of the magnetic anomaly by the second magnetometer. When this occurs, an adjusted baseline is defined between the magnetometers. At least one of the magnetometers is maneuvered to position the adjusted baseline in each of three orthogonal dimensions.

15 Claims, 4 Drawing Sheets

METHOD AND SYSTEM FOR PERFORMING MAGNETIC ANOMALY SENSING

ORIGIN OF THE INVENTION

The invention described herein may be manufactured and used by or for the Government of the United States of America for Governmental purposes without payment of any royalties.

FIELD OF THE INVENTION

The invention relates generally to magnetic sensing, and more particularly to a method and system for performing magnetic anomaly sensing using just two magnetometers.

BACKGROUND OF THE INVENTION

In conventional magnetic gradiometer survey applications that localize magnetic anomalies or targets, a fixed-baseline magnetic gradiometer is typically used. In general, such gradiometers include two or more scalar magnetometers held by a rigid frame to maintain known relative positions. For example, the magnetometers can be mounted/fixed on a moving platform when used to search a particular region. In this typical case, the distance between the individual magnetometers, known as the baseline, has a fixed value that depends on multiple factors including the desired overall size of the gradiometer, the constraints imposed by the platform geometry, the magnetometer technology (e.g., footprint of each element, power requirements, cross-talk considerations, ruggedization aspects, etc.), and the expected magnetic moment of the targets of interest. Existing state-of-the-art magnetic gradiometers cannot be easily modified in the field to allow for variation of their baseline length or orientation in three-dimensional space.

The limitations and disadvantages associated with the above-described conventional magnetic gradiometer sensing systems and methods include the following:

The fixed baseline limits the range of targets the gradiometer can measure. In survey applications, long baselines are desirable for localizing high magnetic moment targets, while short baselines are needed for low magnetic moment targets.

In a conventional long baseline gradiometer, the device can become very large leading to an impractical device/platform whose size/weight requirements limit the number of possible platforms and increase storage space requirements.

Three or more total field (scalar) magnetometers are required in a fixed gradiometer to obtain unambiguous localization of a magnetic object using data from a single pass near the object.

SUMMARY OF THE INVENTION

Accordingly, it is an object of the present invention to provide a method and system for performing magnetic anomaly sensing.

Another object of the present invention is to provide a magnetic anomaly sensing method and system that can be used to sense a variety of target sizes.

Still another object of the present invention is to provide a magnetic anomaly sensing method and system for use in fluid environments.

Other objects and advantages of the present invention will become more obvious hereinafter in the specification and drawings.

In accordance with the present invention, a method and system are provided for performing magnetic anomaly sensing. Each of two magnetometers generates magnetic field measurements sensed thereby. The magnetometers define a one-dimensional gradiometer having a baseline between the magnetometers. A difference value is generated using the magnetic field measurements generated by the magnetometers. The magnetometers are independently moved to maintain the baseline when the difference value is approximately zero and/or approximately constant as a function of time. Detection of a magnetic anomaly by a first of the magnetometers is indicated when the difference value deviates from its previous approximately zero or approximately constant valuation. Following this detection of a magnetic anomaly, a second of the magnetometers is maneuvered until the magnetic field measurements generated thereby are indicative of detection of the magnetic anomaly by the second of the magnetometers. When this occurs, an adjusted baseline is defined between the magnetometers. At least one of the magnetometers is maneuvered to position the adjusted baseline in each of three orthogonal dimensions, which allows for localization of the anomaly.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
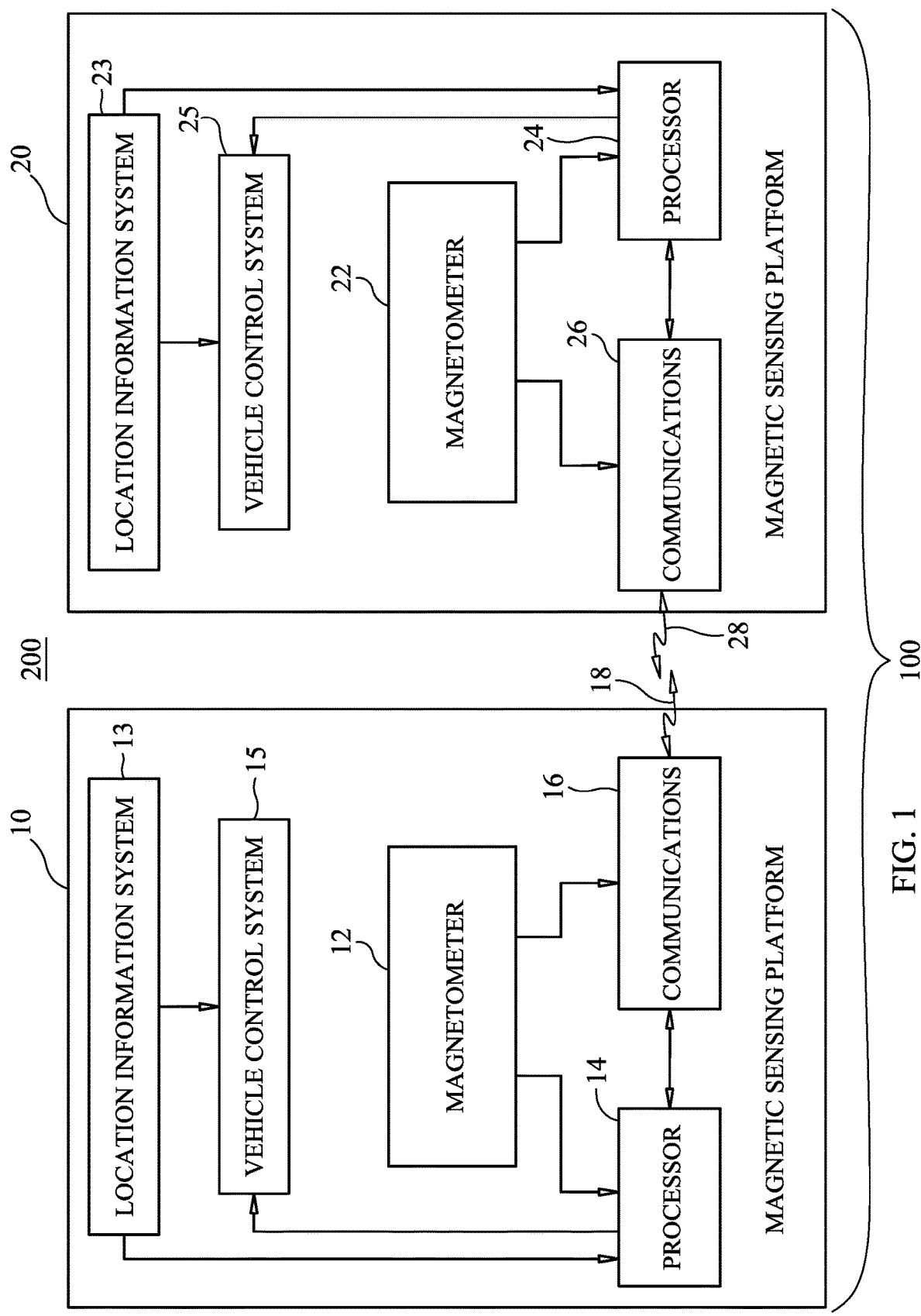
FIG. 1 is a block diagram of a system that can be used to perform magnetic anomaly sensing in an environment in accordance with an embodiment of the present invention.

Referring now to the drawings and more particularly to FIG. 1, a block diagram of a system that can be used to perform magnetic anomaly sensing in accordance with an embodiment of the present invention is shown and is referenced generally by numeral 100. The operational environment (referenced by numeral 200) for magnetic anomaly sensing system 100 can be a fluid environment (e.g., air, water, oil, etc.), a non-permeable sediment environment (e.g., sand, soil, mud, etc.), or a vacuum environment such as space.

Magnetic anomaly sensing system 100 includes two separate magnetic sensing platforms 10 and 20. Each of platforms 10 and 20 is constructed for independent movement in environment 200 where magnetic anomaly sensing will take place. For example, if the environment is air, each of platforms 10 and 20 can include ground-based or air-based vehicle attributes where such vehicle attributes can be realized by a manned or unmanned vehicle without departing from the scope of the present invention. If the environment is water, each of platforms 10 and 20 can include underwater vehicle attributes where such vehicle attributes can be realized by a manned or unmanned underwater vehicle without departing from the scope of the present invention. In general, platforms 10 and 20 include appropriate vehicle attributes for movement in and through an application environment as would be understood in the relevant art.

Magnetic sensing platform 10 includes a magnetometer (e.g., a scalar magnetometer or a vector magnetometer mounted on platform 10), an onboard processor 14, and an onboard communications module or system 16. Platform 10 will also include a location information system 13 (e.g., GPS, etc.) and a vehicle control system 15 responsive to location information received from system 13 and control signals received from processor 14. Such systems and their operation are well-understood in the art. In a similar fashion, magnetic sensing platform 20 includes a magnetometer 22 (e.g., a scalar magnetometer), an onboard processor 24, and an onboard communications module or system 26. Platform 20 will also include a location information system 23 (e.g., GPS, etc.) and a vehicle control system 25 responsive to location information received from system 23 and control signals received from processor 24. Since both platforms 10 and 20 operate in the same fashion, a functional description of magnetic sensing platform 10, provided below, will also apply to magnetic sensing platform 20.

Magnetometer 12 can be any of a variety of commercially-available magnetometers capable of generating scalar magnetic field measurements. The scalar magnetic field measurements generated by magnetometer 12 are provided to processor 14 where the processor can be realized by any of a variety of processing devices/systems without departing from the scope of the present invention. Communications 16 is representative of any of a variety of wireless (or wired) communications modules/systems capable of wireless (or wired) transmission and reception as indicated by two-headed arrow 18. Communication 16 is selected based on the needs of a particular application. For example, for air-based systems, communications 16 can utilize one or more of electromagnetic wave, cellular, Bluetooth, WiFi, etc., technologies without departing from the scope of the present invention. For water-based systems, communications 16 can utilize one or more of acoustic, photonic, flexible communication cable, etc., technologies without departing from the scope of the present invention.

Figure 2:
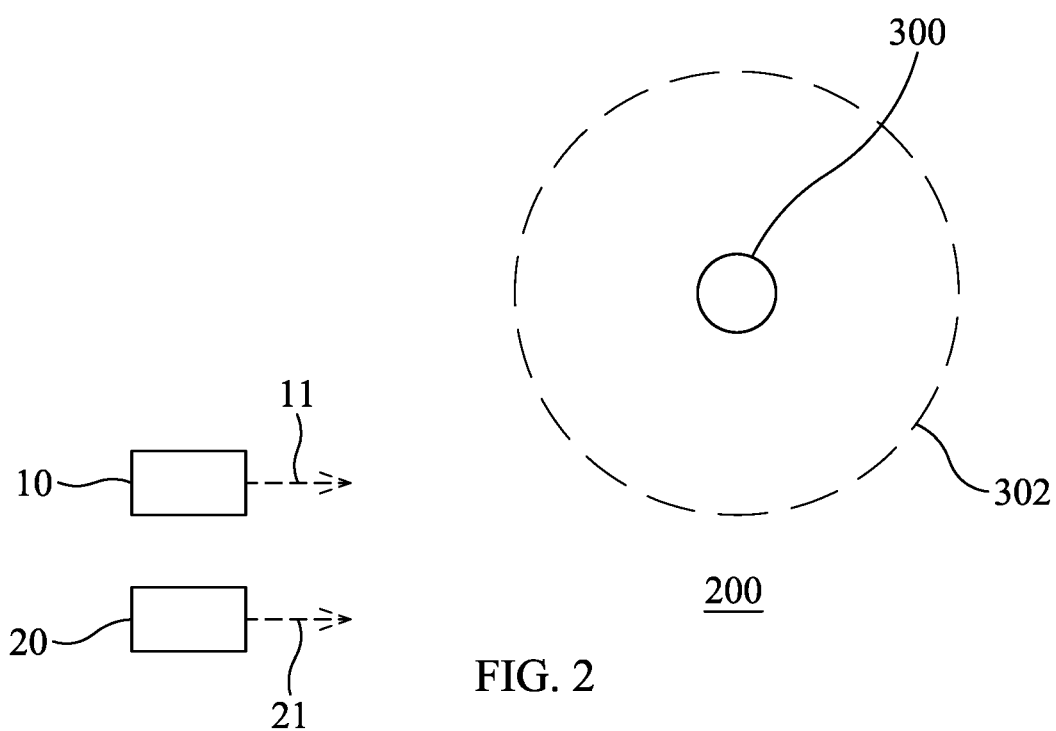
FIG. 2 is a schematic view of two magnetic sensing platforms in an environment in accordance with an embodiment of the present invention prior to detection of a magnetic anomaly.

A method for performing a magnetic anomaly sensing mission in accordance with an embodiment of the present will now be explained with reference to the operational sequence depicted in FIGS. 2-7 where the above-described magnetic sensing platforms 10 and 20 are assumed to be in environment 200 such as a fluid or vacuum environment. Referring first to FIG. 2, magnetic sensing platforms 10 and 20 are illustrated as experiencing independent movement in environment 200 as indicated by arrows 11 and 21, respectively. As is known in the art, an ambient magnetic field (e.g., Earth's magnetic field) can be sensed/measured in environment 200 by platforms 10 and 20 where such measurements will be approximately the same absent the presence of local magnetic anomalies.

Throughout the sensing mission, one of platforms 10 and 20 provides its collected magnetic field measurements to the other platform, or platforms 10 and 20 can exchange magnetic field measurements collected by their respective magnetometers 12 and 22. By way of an illustrative example, the two-way exchange scenario will be explained herein. With continuing reference to FIG. 1, the magnetic field measurements collected by magnetometer 12 are provided to onboard processor 14 and to communications 16 where the magnetic field measurements at platform 10 are transmitted into environment 200 as wireless or wired transmissions 18 for reception by communications 26. In a similar fashion, the magnetic field measurements collected by magnetometer 22 are provided to onboard processor 24 and to communications 26 where the magnetic field measurements at platform 20 are transmitted into environment 200 as wireless or wired transmissions 28 for reception by communications 16. Then, throughout the sensing mission, at least one of processors 14 and 24 generates a difference value using the magnetic field measurements collected by its platform's magnetometer and the magnetic field measurements received by the other platform's magnetometer. When no magnetic anomaly is present in the sensing range of either magnetometer, the only magnetic field that will be sensed is the one due to Earth's magnetic field thereby leading to a difference value of zero (or approximately zero) or a difference value that remains approximately constant as a function of time. As used herein, the term "approximately constant" (or approximately zero) is generally defined in terms of some threshold for a deviation from the historical difference value. A deviation in the range of 5-10% from the historical difference value would be typical for many applications. That is, if the difference signal changed by more than the threshold, this would be indicative of a magnetic anomaly. The difference value is generated by one or both of onboard processors 14 and 24. As a result, magnetometers 12 and 22 essentially reside at the end points of a one-dimensional gradiometer with the distance between the magnetometers (also known as the baseline) being maintained by independent movements 11 and 21 until a magnetic anomaly is detected.

For purposes of the illustrated embodiment, it is assumed that there is an object/target or magnetic anomaly 300 of interest that is present in the environment 200 at a fixed location. Magnetic anomaly 300 includes ferrous material such that a detectable magnetic field disturbance surrounds magnetic anomaly 300 as indicated by dashed-line circle 302. The radius of circle 302 depends on the practical sensitivity of the magnetometer/platform system.

Figure 3:
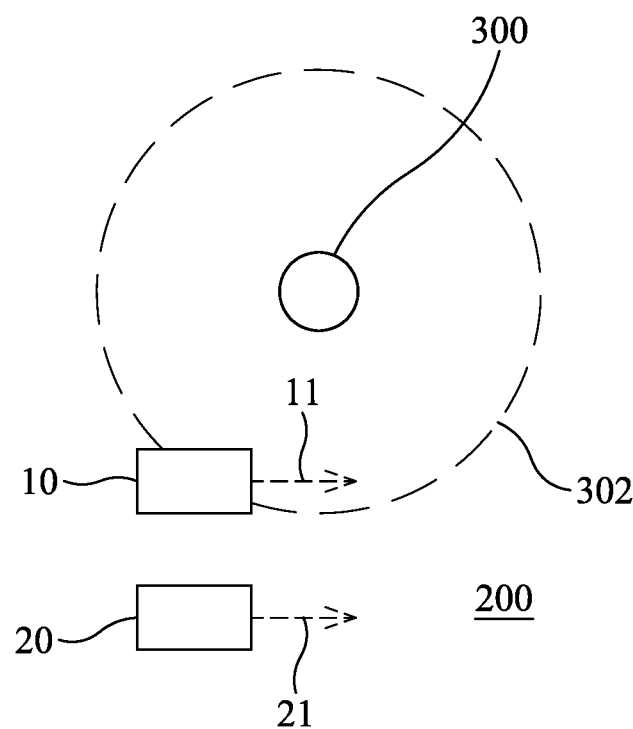
FIG. 3 is a schematic view of the two magnetic sensing platforms after a first of the sensing platforms enters a magnetic field disturbance associated with the magnetic anomaly.

During the course of independent movements 11 and 21 in the illustrated example, magnetic sensing platform 10 encounters magnetic field disturbance 302 as illustrated in FIG. 3. It is assumed that this has occurred during a search/reconnaissance mission in which platforms 10 and 20 are searching for magnetic anomaly 300. Once platform 10 enters magnetic field disturbance 302, the difference value generated using the magnetic field measurements from platforms 10 and 20 will no longer be near zero or nearly constant as a function of time. Instead, in the illustrated example, the difference value generated by processor 14 and/or 24 will deviate from the near zero valuation or the nearly constant valuation (i.e., positively or negatively) since the magnetic field due to the disturbance 302 is added to or subtracted from the Earth's background magnetic field with this combination being sensed by magnetometer 12 while magnetometer 22 continues to only sense the Earth's background magnetic field.

Figure 4:
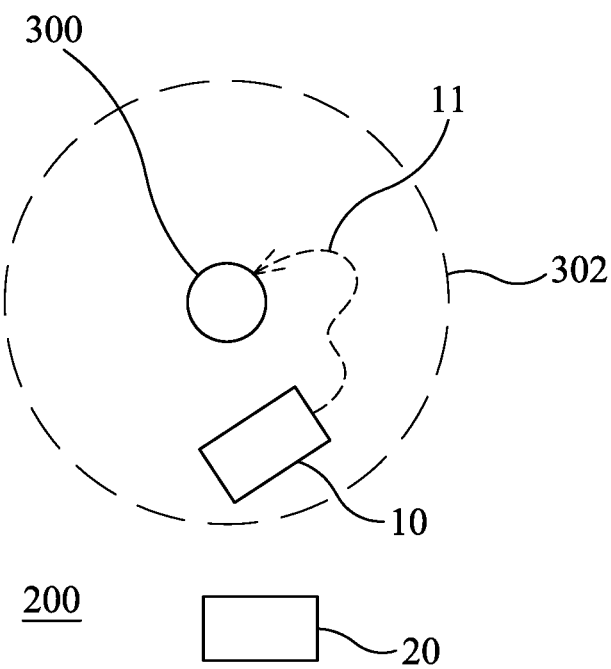
FIG. 4 is a schematic view of the two magnetic sensing platforms with the first of the sensing platforms being illustrated as undergoing maneuvers to maximize the magnetic field disturbance sensed thereby.
Figure 5:
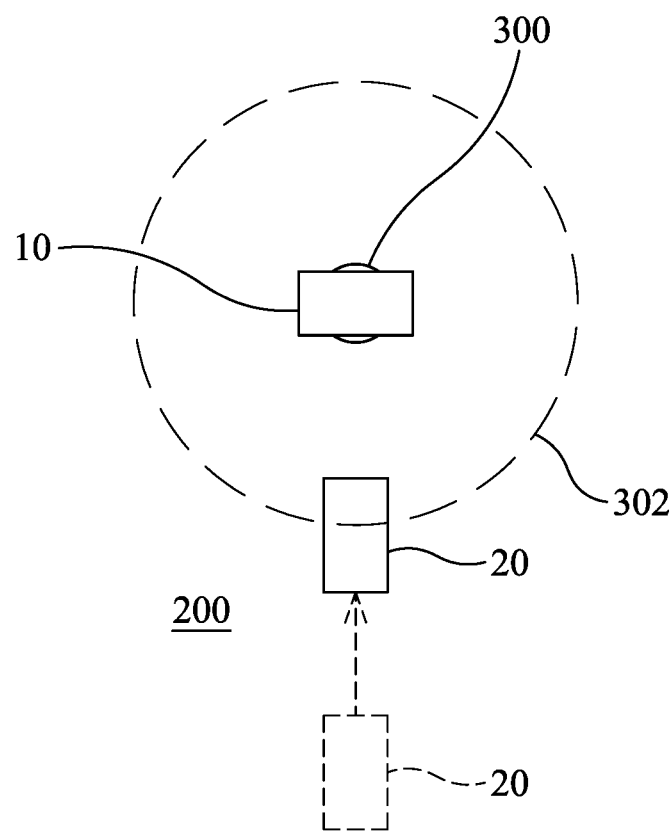
FIG. 5 is a schematic view of the two magnetic sensing platforms with the second of the sensing platforms being illustrated as undergoing maneuvers to cause the second of the sensing platforms to enter the magnetic anomaly field disturbance associated with the magnetic anomaly.

The next step in the magnetic sensing method of the present invention is illustrated in FIG. 4. In general, the platform whose signal deviates most from its own short-term time averaged signal (e.g., platform 10 in the illustrated example) is maneuvered in the environment 200 until the difference generated by its onboard processor is maximized. For example and in the illustrated embodiment, platform 10 could be maneuvered via its independent movement 11 at a constant elevation (e.g., altitude in air or depth in water). To simplify the search process, platform 20 could be controlled to hover in place thereby assuring that it only senses/measures Earth's background magnetic field. Such control can be provided by onboard personnel piloting platform 20 or through the use of unmanned vehicle control systems in ways well-understood in the art.

Following the maximization process illustrated in FIG. 4, the magnetic sensing method of the present invention proceeds by maneuvering platform 20 via its independent movement 21 until platform 20 also senses disturbance 302 when the output of magnetometer 22 deviates significantly from its historical time-averaged value determined by the ambient magnetic field, thereby indicating a detection of magnetic anomaly 300 by magnetometer 22 on platform 20. During this time, platform 10 can be controlled to hover in place at the location where its measured distance value is maximized. Movement of platform 20 relative to platform 10 can be accomplished in a variety of ways known in the art without departing from the scope of the present invention. For example, both platforms can utilize their location information systems (e.g., GPS, radar locators, acoustic locators, magnetic-based locators, etc.). To simplify the determination of disturbance 302 by platform 20, platform 10 can be controlled to hover in place as platform 20 moves towards platform 10.

Figure 6:
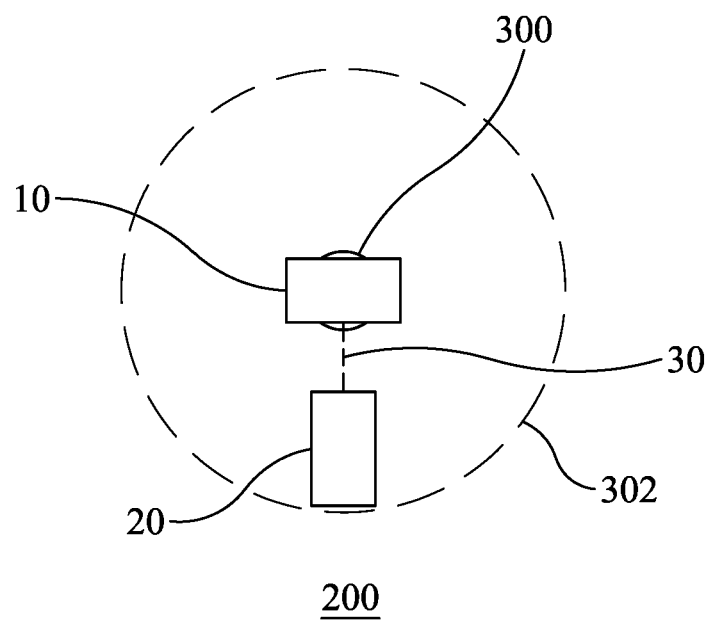
FIG. 6 is a schematic view of the two magnetic sensing platforms in the magnetic field disturbance of the magnetic anomaly to thereby define a one-dimensional baseline between the sensing platforms in accordance with an embodiment of the present invention.
Figure 7:
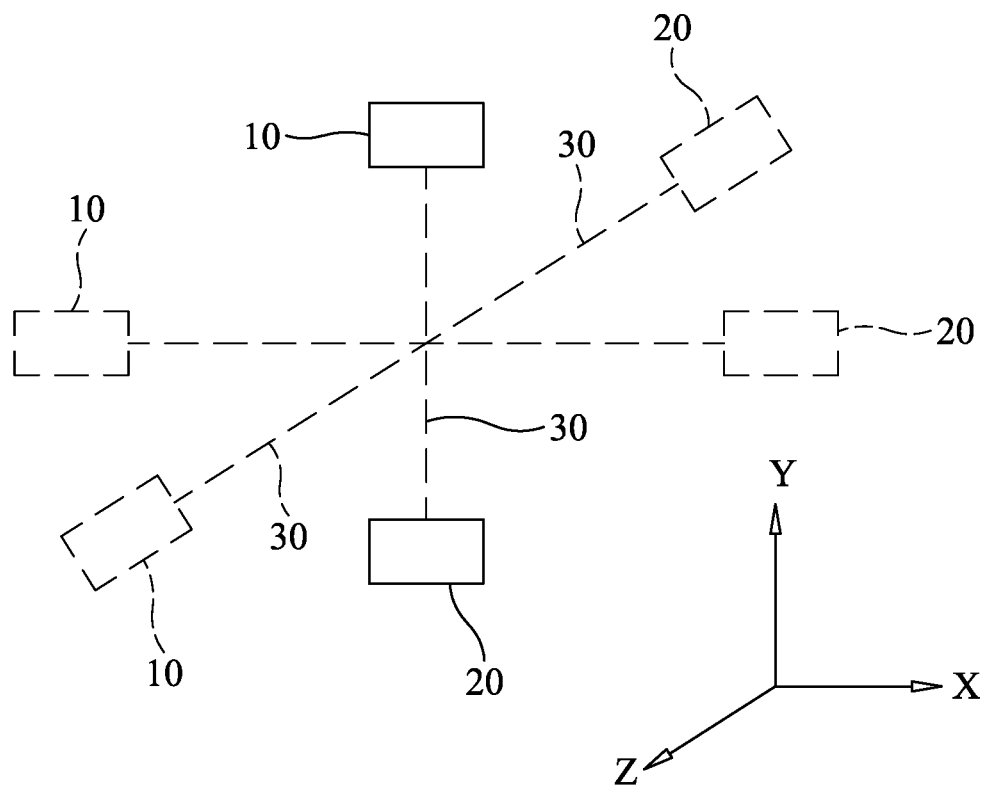
FIG. 7 is an isolated schematic view of the two magnetic sensing platforms illustrating platform maneuvers that orient the one-dimensional baseline in each of three orthogonal dimensions in accordance with an embodiment of the present invention.

Referring now to FIG. 6, once platform 20 encounters/enters disturbance 302, the gradiometer formed by magnetometers 12 and 22 onboard platforms 10 and 20, respectively, the one-dimensional axis or baseline is essentially redefined between the two magnetometers as indicated by dashed-line 30 in FIG. 6. For maximum sensitivity, platforms 10 and 20 can be maneuvered to optimize baseline 30, i.e., shorten or lengthen baseline 30 depending on the magnetic strength of the magnetic anomaly. The optimal baseline value is defined as the longest baseline possible in which both magnetometers 12 and 22 can sense the disturbance 302 with adequate sensitivity.

Once the optimal baseline 30 is established, the magnetic sensing method of the present proceeds by maneuvering one or both of platforms 10 and 20 to manipulate baseline 30 as magnetic field measurements are continually collected and processed, resulting in localization of the magnetic anomaly. In general, and with reference to FIG. 7, platform 10 and/or platform 20 are maneuvered via their respective and independent movements such that baseline 30 is positioned along each of three orthogonal dimensions as indicated by the x-y-z coordinate designation in FIG. 7. For example, platform 10 could be hovered while platform 20 circled about platform 10 to achieve the needed orthogonal relationships.

The advantages of the present invention are numerous. Due to the individual mobility of each magnetometer, the distance between them is not fixed. The ability to change the distance between the magnetometers and their relative angular orientation provides a dynamic baseline which can be shortened or lengthened based on the field gradient detected. This provides the ability to use a short baseline for weak magnetic anomalies and a long baseline for stronger magnetic anomalies with the same device. In addition, the baseline axis can be adjusted to be horizontal, vertical, or any angular orientation to optimize detection of targets. In one embodiment of the invention, the end user can remotely tune or adjust the baseline length and orientation using a prior knowledge of the desired target characteristics. In another embodiment, the individual platforms that carry the magnetometers can possess autonomous capabilities that allow them to dynamically adjust the baseline based on continuous differencing of the magnetometer readings.

The present invention measures the field gradient at the baseline angular orientation where the baseline angular orientation can vary continuously in three dimensions. In this way, dense three-dimensional maps can be constructed consisting of the gradient field around a target or group of targets. This type of mapping is advantageous in magnetically cluttered environments, for magnetic object characterization, or for magnetic orientation characterization.

The present invention provides a number of cost advantages. For example, target detection, localization, and magnetic moment estimation can be achieved using only two scalar magnetometers performing pair-wise maneuvers near a target. Three-dimensional information about the total magnetic field gradient can be obtained using only two scalar magnetometers. The system of the present invention can embody a modular structure such that if a single magnetometer failed, it could be replaced without replacing the entire system.

The present invention provides a number of portability advantages. For example, the three-dimensional magnetic gradiometer can be packed into a small volume when not in use. The system can be packed into the same volume for storage regardless of the length of baseline desired as thereby providing for a very long baseline gradiometer requiring relatively little storage space. The present invention is not limited by platform/vehicle size.

The present invention provides improved detection, characterization, and dynamic range. A magnetic gradiometer can be formed using just two magnetometers on independently mobile platforms such that the inter-magnetometer distance or baseline can be varied over a very wide range. The approach described herein is applicable to the localization and characterization of small, medium, and large magnetic objects. The dynamic baseline approach can provide the ideal baseline length for a wide variety of target strengths or magnetic dipole moments such that a single survey can measure a wide range of target strengths without a change of hardware.

The present invention provides new measurement paradigms. The baseline can be dynamically adjusted based upon real-time measurements of the local magnetic field gradient to allow homing behaviors for target/anomaly localization. The configuration provides for measurement at a baseline angular orientation that maximizes the scalar or total field difference for a given target dipole moment vector orientation relative to the local Earth field vector.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method for performing magnetic anomaly sensing, comprising the steps of:
   providing two magnetometers, each of said magnetometers generating magnetic field measurements sensed thereby wherein said magnetometers define a one-dimensional gradiometer having a baseline between said magnetometers;
   generating a difference value using said magnetic field measurements generated by said magnetometers;
   independently moving each of said magnetometers to maintain said baseline when said difference value is one of approximately zero or approximately constant as a function of time, wherein detection of a magnetic anomaly by a first of said magnetometers is indicated when said difference value deviates from said one of approximately zero or approximately constant as a function of time;
   maneuvering, following said detection of a magnetic anomaly, said first of said magnetometers to maximize said difference value;
   maneuvering, following said step of maneuvering said first of said magnetometers, a second of said magnetometers until said magnetic field measurements generated thereby are indicative of detection of the magnetic anomaly by said second of said magnetometers wherein an adjusted baseline is defined between said magnetometers; and
   maneuvering at least one of said magnetometers to position said adjusted baseline in each of three orthogonal dimensions.

2. A method according to claim 1, wherein each of said magnetometers comprises one of a scalar magnetometer and a vector magnetometer.

3. A method according to claim 1, wherein said steps of generating, moving, and maneuvering are performed in an environment selected from the group consisting of a fluid environment, a vacuum environment, and a sediment environment.

4. A method according to claim 1, further comprising the step of maintaining a position of said first of said magnetometers while performing said step of maneuvering said second of said magnetometers.

5. A method according to claim 1, wherein said step of maneuvering said first of said magnetometers to maximize said difference value is performed at a constant elevation.

6. A method according to claim 1, wherein said step of maneuvering said second of said magnetometers comprises the step of moving said second of said magnetometers relative to said first of said magnetometers.

7. A method for performing magnetic anomaly sensing in an environment, comprising the steps of:
   providing two platforms for independent movement in the environment;
   providing a magnetometer on each of said platforms, each said magnetometer generating scalar magnetic field measurements sensed thereby wherein each said magnetometer resides at an end point of a one-dimensional gradiometer having a baseline;
   generating a difference value using said scalar magnetic field measurements generated by each said magnetometer;
   independently moving each of said platforms in the environment to maintain said baseline when said difference value is one of approximately zero and approximately constant as a function of time, wherein detection of a magnetic anomaly in the environment at a first of said platforms is indicated when said difference value deviates from said one of approximately zero and approximately constant as a function of time;
   maneuvering a second of said platforms until said scalar magnetic field measurements generated thereat are indicative of detection of the magnetic anomaly at said second of said platforms wherein an adjusted baseline is defined between said magnetometer on said first platform and said magnetometer on said second platform; and
   maneuvering at least one of said platforms in the environment to position said adjusted baseline along each of three orthogonal dimensions.

8. A method according to claim 7, further comprising the step of maintaining a position of said first of said platforms while performing said step of maneuvering said second of said platforms.

9. A method according to claim 7, further comprising the step of maneuvering said first of said platforms to maximize said difference value prior to said step of maneuvering said second of said platforms.

10. A method according to claim 9, wherein said step of maneuvering said first of said platforms to maximize said difference value is performed at a constant elevation in the environment.

11. A method according to claim 7, wherein said step of maneuvering said second of said platforms comprises the step of moving said second of said platforms relative to said first of said platforms.

12. A system for performing magnetic anomaly sensing, comprising:
   a first independently-movable platform;
   a first magnetometer mounted on said first independently-movable platform for generating first scalar magnetic field measurements sensed thereby;
   a first processor provided on said first independently-movable platform and coupled to said first magnetometer;
   a first communications system mounted on said first independently-movable platform and coupled to said first magnetometer for transmitting said first scalar magnetic field measurements;
   a second independently-movable platform;
   a second magnetometer mounted on said second independently-movable platform for generating second scalar magnetic field measurements sensed thereby;
   a second processor provided on said second independently-movable platform and coupled to said second magnetometer;
   a second communications system mounted on said second independently-movable platform and coupled to said second magnetometer for transmitting said second scalar magnetic field measurements;
   said first communications system receiving said second scalar magnetic field measurements and said first processor generating a first difference value using said first scalar magnetic field measurements and said second scalar magnetic field measurements; and said second communications system receiving said first scalar magnetic field measurements and said second processor generating a second difference value using said second scalar magnetic field measurements and said first scalar magnetic field measurements.

13. A system as in claim 12, wherein each of said first platform and said second platform is selected from the group consisting of an underwater vehicle, an aerial vehicle, and a ground vehicle.

14. A system as in claim 12, wherein said first magnetometer comprises one of a scalar magnetometer and a vector magnetometer.

15. A system as in claim 12, wherein said second magnetometer comprises one of a scalar magnetometer and a vector magnetometer.

* * * * *